(12) United States Patent
Eimitsu et al.

(10) Patent No.: US 11,476,848 B2
(45) Date of Patent: Oct. 18, 2022

(54) SEMICONDUCTOR INTEGRATED CIRCUIT DEVICE AND RECEPTION DEVICE

(71) Applicant: Kioxia Corporation, Tokyo (JP)

(72) Inventors: Masatomo Eimitsu, Kawasaki (JP); Yoshitaka Sampei, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 23 days.

(21) Appl. No.: 17/014,823

(22) Filed: Sep. 8, 2020

(65) Prior Publication Data

US 2021/0305981 A1    Sep. 30, 2021

(30) Foreign Application Priority Data

Mar. 24, 2020    (JP) .............................. JP2020-052047

(51) Int. Cl.
   *H03K 17/687*    (2006.01)

(52) U.S. Cl.
   CPC ..... *H03K 17/6872* (2013.01); *H03K 17/6874* (2013.01)

(58) Field of Classification Search
   CPC ....................... H03K 17/6872; H03K 17/6874
   See application file for complete search history.

(56) References Cited

U.S. PATENT DOCUMENTS

| | | | |
|---|---|---|---|
| 5,126,974 A | 6/1992 | Sasaki et al. | |
| 5,518,409 A | 5/1996 | White | |
| 6,147,514 A * | 11/2000 | Shiratake | G11C 7/065 327/55 |
| 6,480,037 B1 * | 11/2002 | Song | G11C 7/065 327/55 |
| 7,046,567 B2 * | 5/2006 | Kim | G11C 7/065 365/207 |
| 8,199,559 B2 | 6/2012 | Gaya | |
| 2006/0244502 A1 * | 11/2006 | Kim | H03K 3/356139 327/208 |
| 2007/0147112 A1 | 6/2007 | Edahiro et al. | |

FOREIGN PATENT DOCUMENTS

| | | |
|---|---|---|
| JP | 3841221 B2 | 11/2006 |
| JP | 4901211 B2 | 3/2012 |
| JP | 5518409 B2 | 6/2014 |

* cited by examiner

*Primary Examiner* — Ryan Johnson
*Assistant Examiner* — Colleen J O Toole
(74) *Attorney, Agent, or Firm* — Oblon, McClelland, Maier & Neustadt, L.L.P.

(57) ABSTRACT

According to one embodiment, a semiconductor integrated circuit device comprises first and second transistors having control terminals receiving an input signal and an inversion signal of the input signal, third and fourth transistors having control terminals receiving the input signal and the inversion signal, first and second inverters in which outputs are connected to inputs of other converters, and a fifth transistor connected to the first to fourth transistors. The third and fourth transistors are connected to outputs of the second and the first inverters. Clock signal is supplied to the fifth transistor.

16 Claims, 9 Drawing Sheets

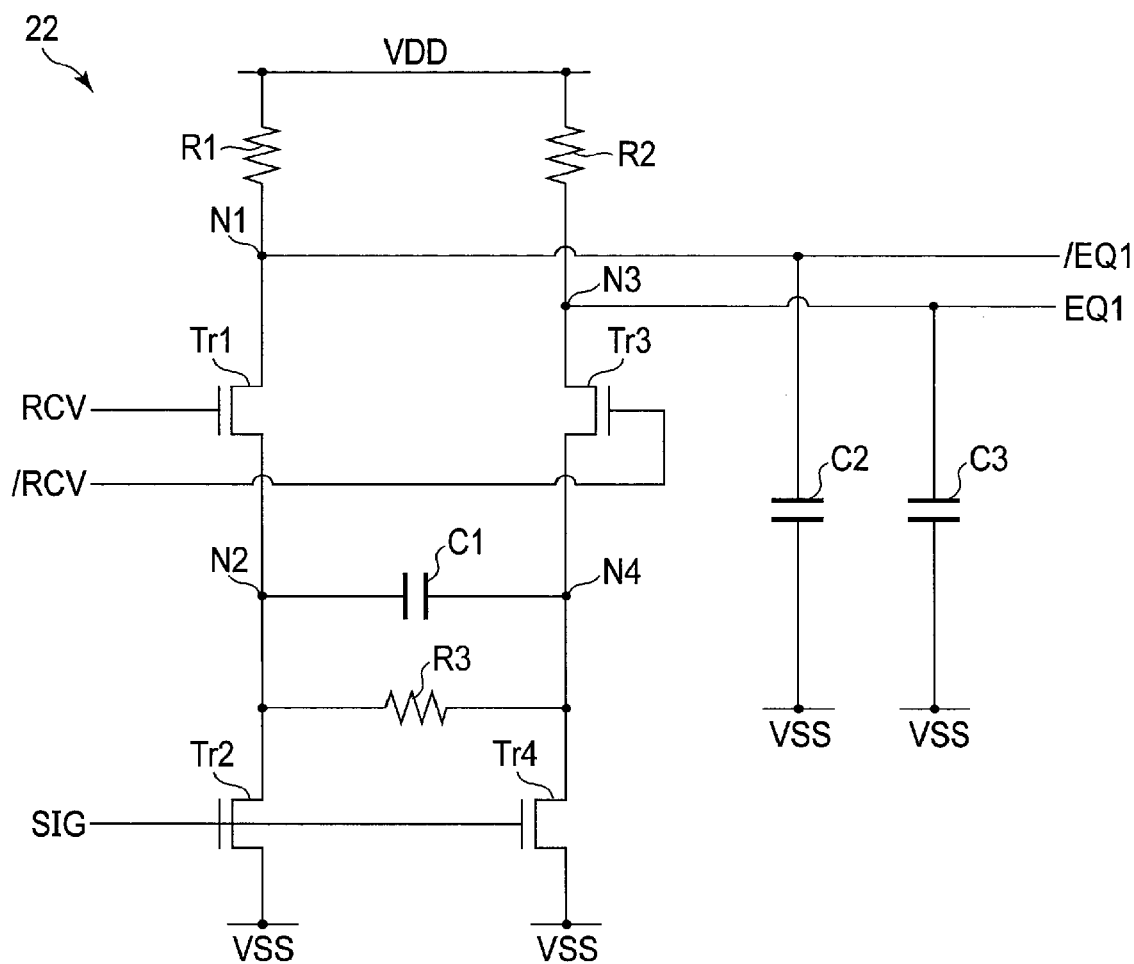
F I G. 4
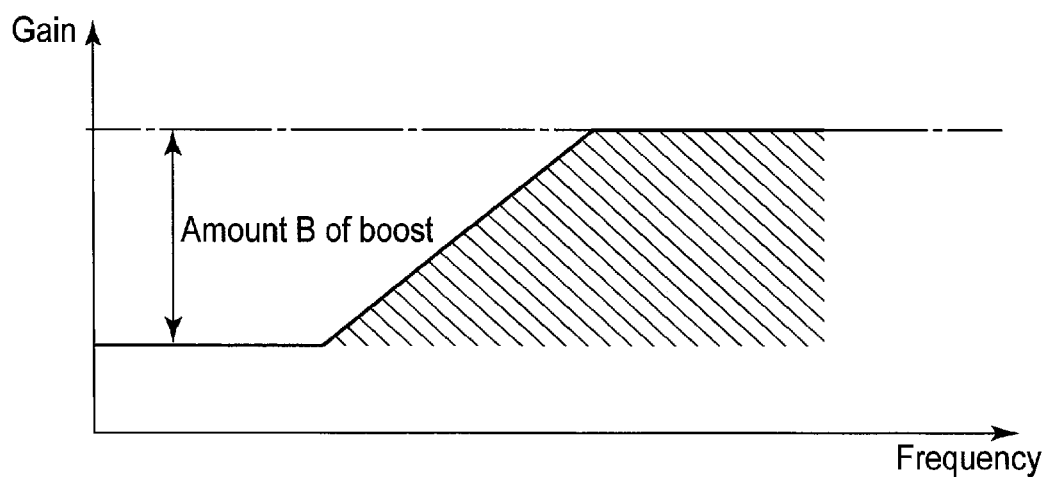
F I G. 5

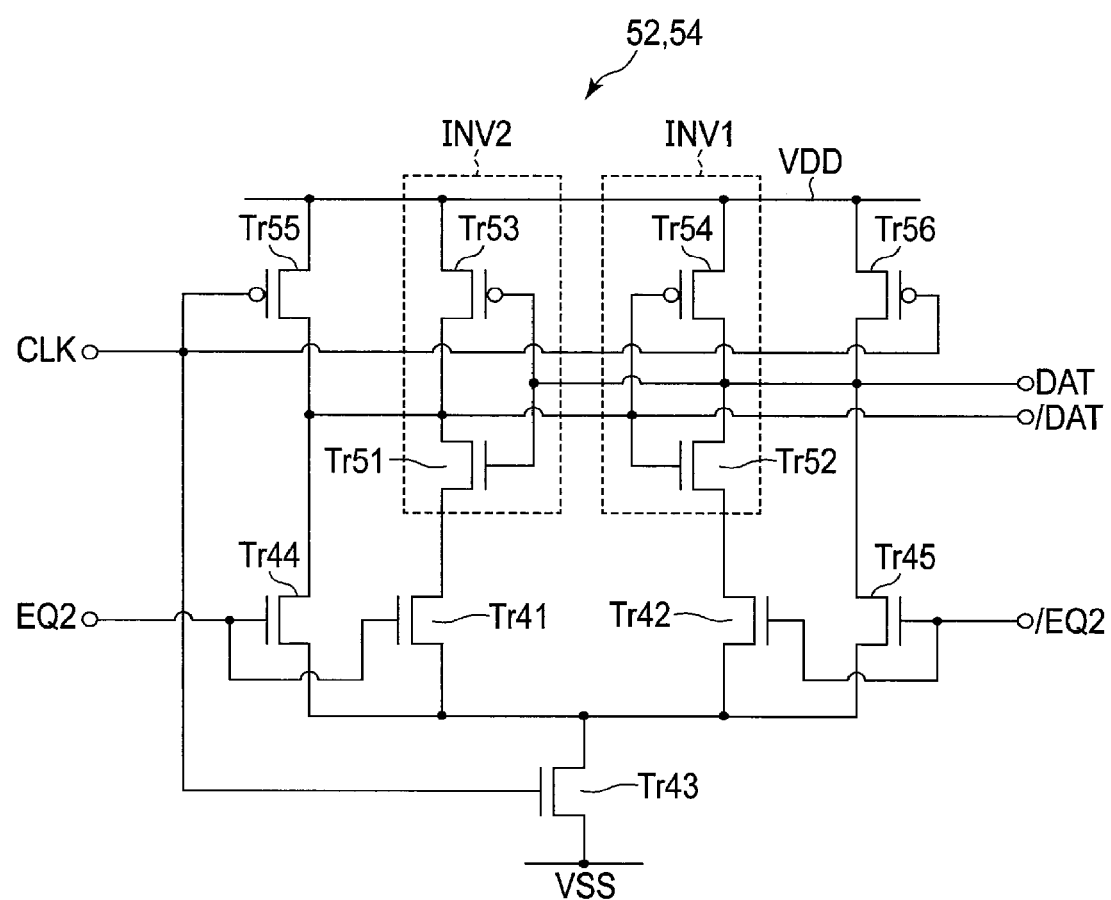
F I G. 8

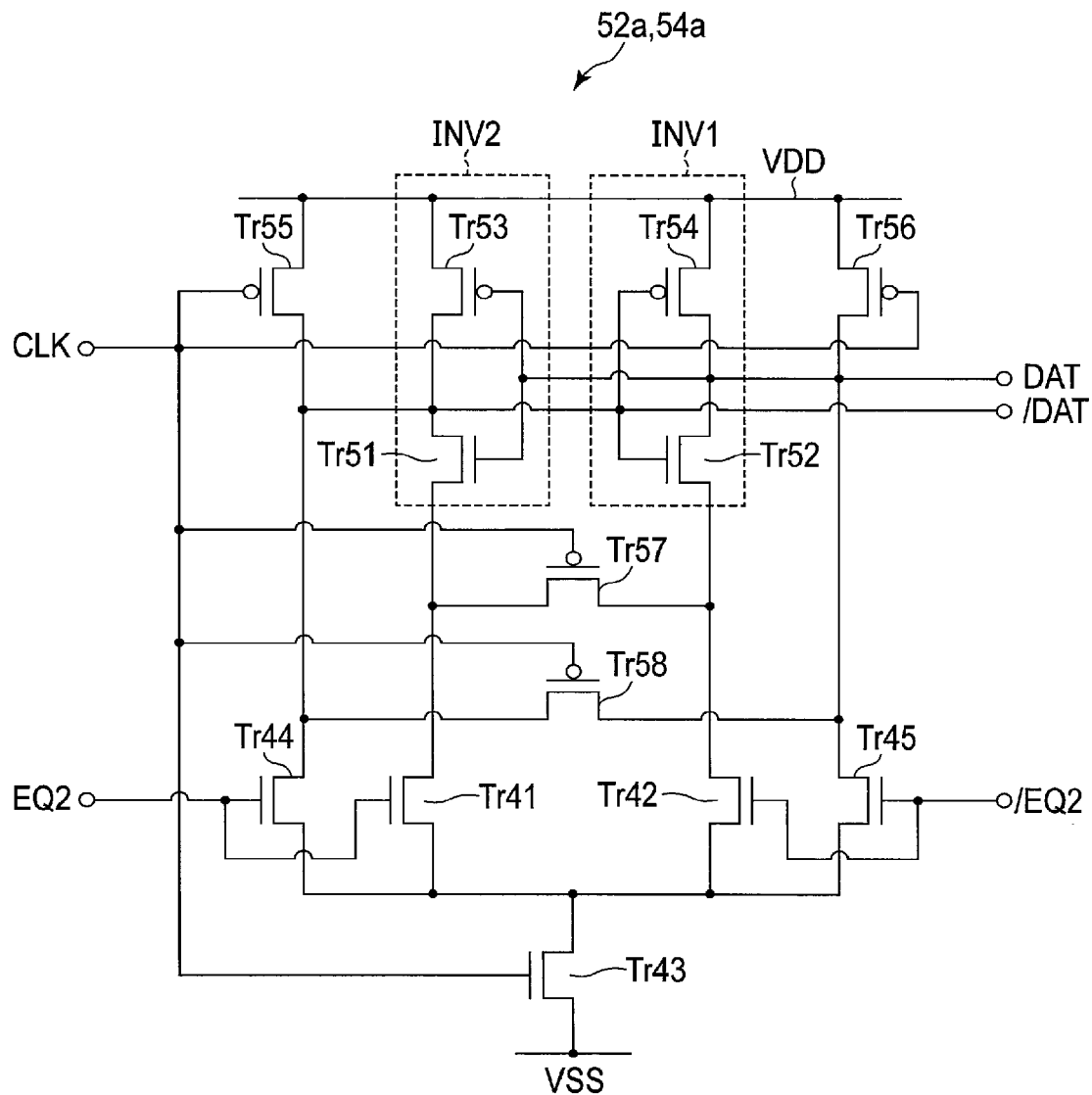
F I G. 10

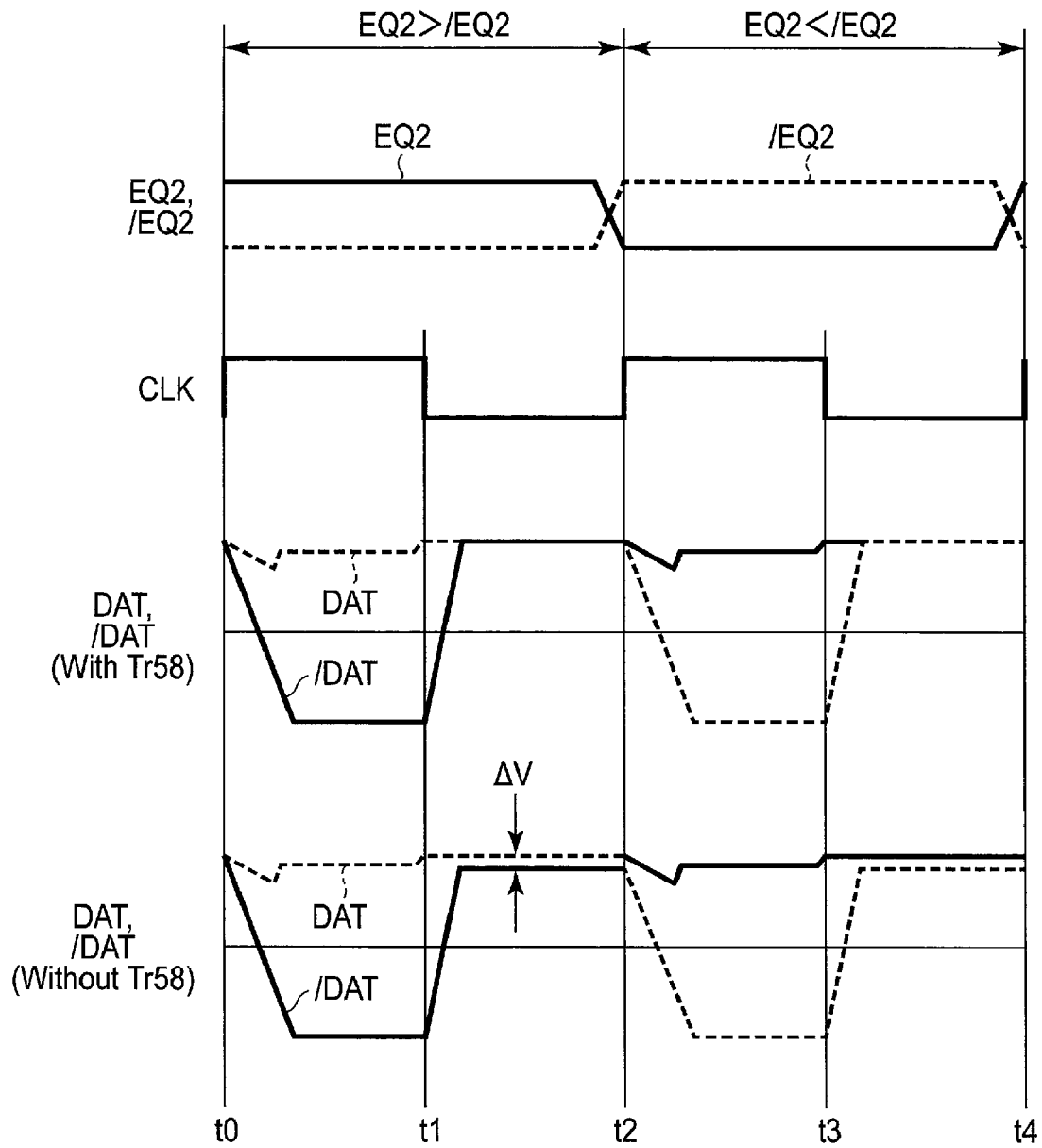
F I G. 11

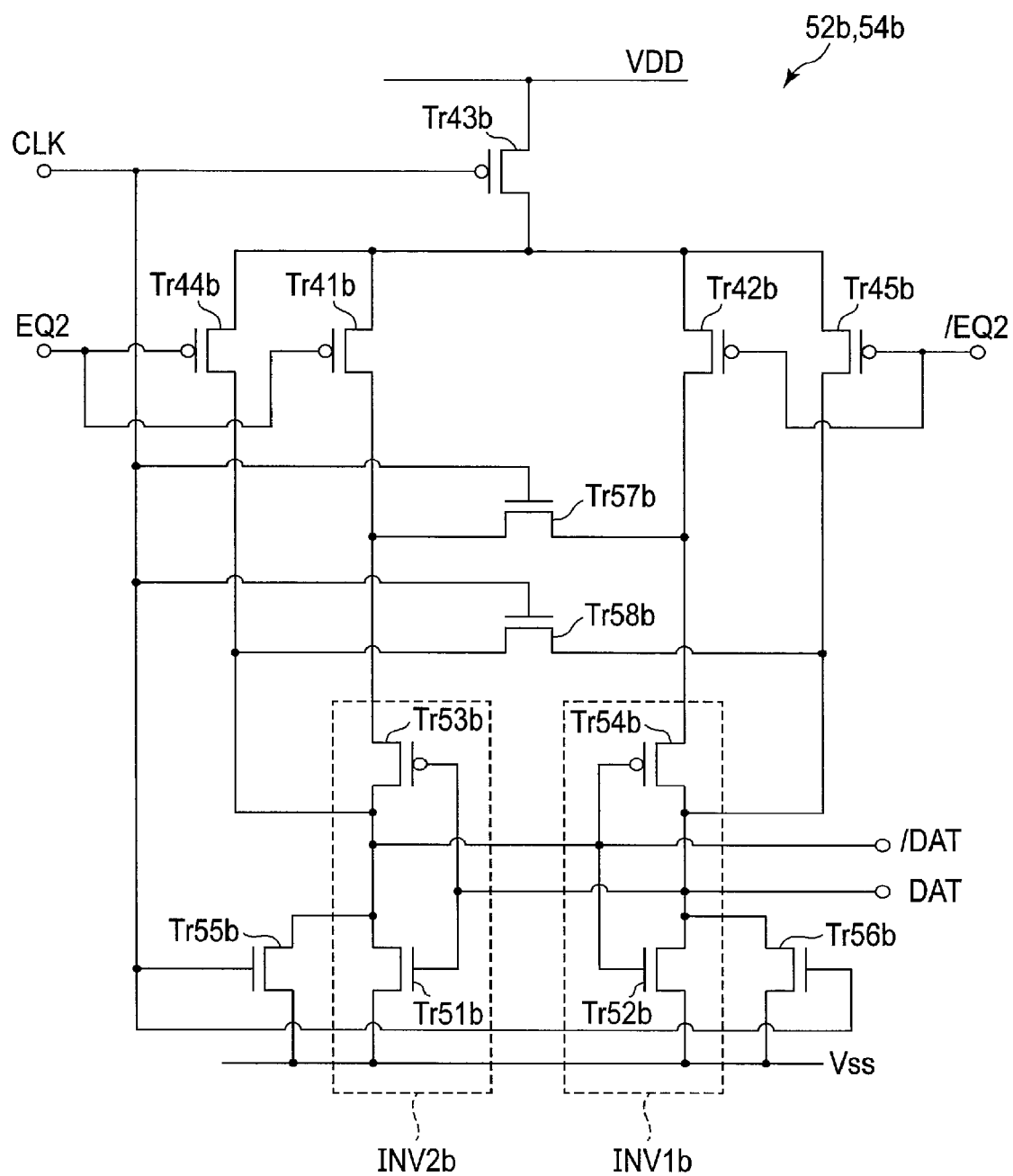
F I G. 12

SEMICONDUCTOR INTEGRATED CIRCUIT DEVICE AND RECEPTION DEVICE

CROSS-REFERENCE TO RELATED APPLICATIONS

This application is based upon and claims the benefit of priority from Japanese Patent Application No. 2020-052047, filed Mar. 24, 2020, the entire contents of which are incorporated herein by reference.

FIELD

Embodiments described herein relate generally to a semiconductor integrated circuit device and a reception device.

BACKGROUND

A reception device includes a semiconductor integrated circuit device for performing transmission of serial data with respect to a transmitting device. In the transmission of serial data, the semiconductor integrated circuit device is provided in the reception device. The semiconductor integrated circuit device includes a circuit which compensates a loss caused during the transmission of signals. The process for this compensation is required to increase the processing speed.

BRIEF DESCRIPTION OF THE DRAWINGS

FIG. 4 is a circuit diagram showing an example of a CTLE (Continuous Time Linear Equalizer) circuit in the first embodiment.

FIG. 5 is a diagram showing an example of a equalization characteristics of the CTLE circuit in the first embodiment.

FIG. 8 is a circuit diagram showing an example of determination circuits in the sampler circuit shown in FIG. 6.

FIG. 10 is a circuit diagram showing another example of the determination circuits.

FIG. 11 is a timing chart of an operation example of the determination circuits shown in FIG. 10.

FIG. 12 is a circuit diagram showing yet another example of the determination circuits.

DETAILED DESCRIPTION

Figure 1:
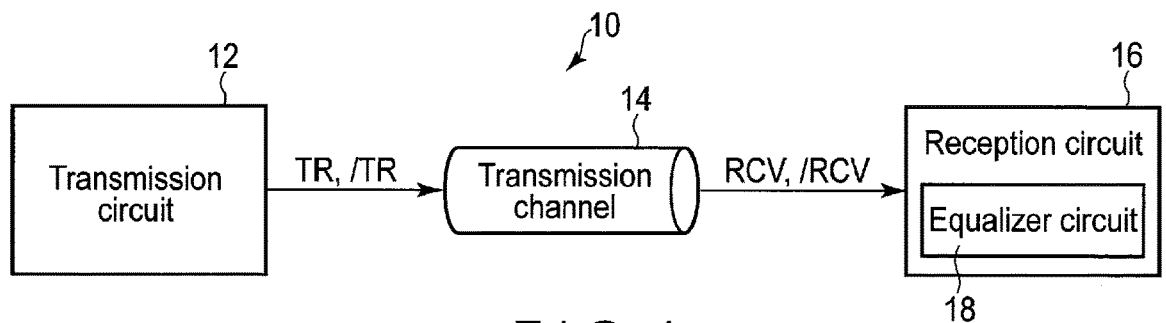
FIG. 1 is a block diagram showing an example of a transmission system including a reception device including a semiconductor integrated circuit device according to a first embodiment.

Various embodiments will be described hereinafter with reference to the accompanying drawings.

The disclosure is merely an example and is not limited by contents described in the embodiments below. Modification which is easily conceivable by a person of ordinary skill in the art comes within the scope of the disclosure as a matter of course. In order to make the description clearer, the sizes, shapes, and the like of the respective parts may be changed and illustrated schematically in the drawings as compared with those in an accurate representation. Constituent elements corresponding to each other in a plurality of drawings are denoted by like reference numerals and their detailed descriptions may be omitted unless necessary.

In general, according to one embodiment, a semiconductor integrated circuit device comprises a first transistor comprising a first terminal, a second terminal, and a control terminal to which an input signal is supplied; a second transistor comprising a first terminal, a second terminal, and a control terminal to which an inversion signal of the input signal is supplied; a first inverter comprising an input terminal, an output terminal, a first terminal to which a first voltage is applied, and a second terminal connected to the first terminal of the second transistor; a second inverter comprising an input terminal, an output terminal, a first terminal to which the first voltage is applied, and a second terminal connected to the first terminal of the first transistor; a third transistor comprising a first terminal, a second terminal, and a control terminal to which the input signal is supplied; a fourth transistor comprising a first terminal, a second terminal, and a control terminal to which the inversion signal is supplied; and a fifth transistor comprising a first terminal connected to the second terminal of the first transistor, the second terminal of the second transistor, the second terminal of the third transistor, the second terminal of the fourth transistor, and comprising a second terminal to which a second voltage different from the first voltage is applied. The output terminal of the first inverter is connected to the input terminal of the second inverter. The output terminal of the second inverter is connected to the input terminal of the first inverter. The first terminal of the third transistor is connected to the output terminal of the second inverter. The first terminal of the fourth transistor is connected to the output terminal of the first inverter.

[Transmission System]

The following description explains a reception device which can transmit serial data at high speed as a semiconductor integrated circuit device according to a first embodiment. FIG. 1 is a block diagram showing an example of a transmission system. A transmission system 10 includes a plurality of circuits and transfers various types of data from a circuit to another circuit, using high-speed serial communication. The transmission system 10 includes a transmission circuit 12, a transmission channel 14, and a reception circuit 16.

The transmission circuit 12 transmits transmission signals TR and /TR which are differential signals to the reception circuit 16 via the transmission channel 14. In this specification, a signal in which "/" is added to the head indicates an inversion signal in which the phase deviates 180 degrees from the original signal in which "/" is not added to the head. The transmission signals TR and /TR may be pulse signals, and may have a digital value allowed to distinguish "0" from "1" in each of successive time points (divisions). The transmission circuit 12 transmits information encoded by the pulse signals to the reception circuit 16 via the transmission channel 14.

The transmission channel 14 is a physical or spatial transmission medium for transmitting the transmission signals TR and /TR to the reception circuit 16. An example of the transmission medium is a wired channel such as a line provided in a print circuit board or cable, or a wireless channel. The transmission channel 14 may include various types of transmission characteristics in accordance with the physical structure or material of the transmission medium. The transmission characteristics may be, for example, frequency characteristics accompanied by a loss in gain in a specific frequency band. The transmission signals TR and /TR are subjected to a loss based on the transmission characteristics of the transmission channel 14, converted into reception signals RCV and /RCV by the transmission channel 14. The reception signals RCV and /RCV are input to the reception circuit 16.

The reception circuit 16 receives the reception signals RCV and /RCV and decodes the information included in the transmission signals TR and /TR based on the reception signals RCV and /RCV. When the waveforms of the reception signals RCV and /RCV are made largely different from those of the transmission signals TR and /TR by the transmission channel 14, the reception circuit 16 may not correctly decode the information. To correctly decode the information included in the transmission signals TR and /TR even in this case, the reception circuit 16 includes an equalizer circuit 18.

The equalizer circuit 18 has a function for compensating a loss caused in a certain frequency band by the transmission characteristics of the transmission channel 14.

Figure 2:
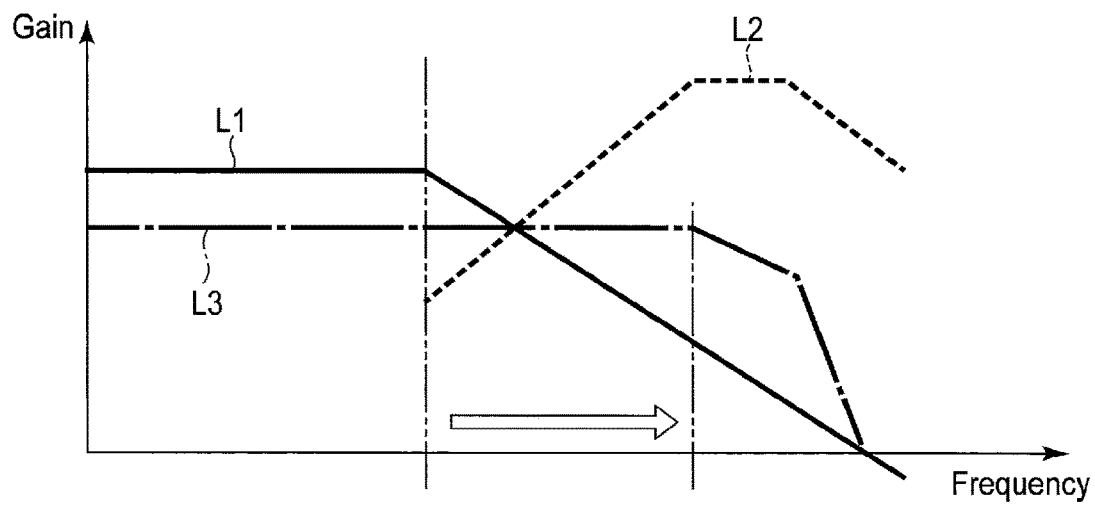
FIG. 2 is a diagram showing an example of a relationship between a loss caused by a transmission channel and a compensation by an equalizer circuit in the first embodiment.

FIG. 2 is a diagram showing an example of a relationship between a loss caused by the transmission channel 14 and a compensation by the equalizer circuit 18. FIG. 2 shows a transmission characteristics L1 of the transmission channel 14, a compensation characteristics (waveform equalization characteristics) L2 of the equalizer circuit 18, and a synthesized characteristics L3 of the transmission characteristics of the transmission channel 14 and the waveform equalization characteristics of the equalizer circuit 18.

The transmission characteristics L1 of the transmission channel 14 have, for example, characteristics as a low-pass filter which damps a high-frequency component. Because of such characteristics, the transmission signals TR and /TR are converted into the reception signals RCV and /RCV in which a high-frequency component is lost through the transmission channel 14. Thus, even when pulse signals having steep edges are transmitted as the transmission signals TR and /TR, the edges may become obtuse in the waveforms of the reception signals RCV and /RCV. Thus, in the reception signals RCV and /RCV, inter symbol interfere (ISI), in which waveforms overlap each other, are easily caused between adjacent divisions originally having respective data items.

The waveform equalization characteristics L2 of the equalizer circuit 18 are set such that a gain of the high-frequency band is higher than that of the low-frequency band. Thus, the synthesized characteristics L3 have characteristics in which a cutoff frequency is shifted to the high-frequency side with respect to the transmission characteristics L1. In other words, a signal which received compensation for a loss by the equalizer circuit 18 is equalized so as to have a waveform allowed to decode the information included in the transmission signals TR and /TR in comparison with the reception signals RCV and /RCV which do not receive compensation for a loss by the equalizer circuit 18.

[Equalizer Circuit 18]

Figure 3:
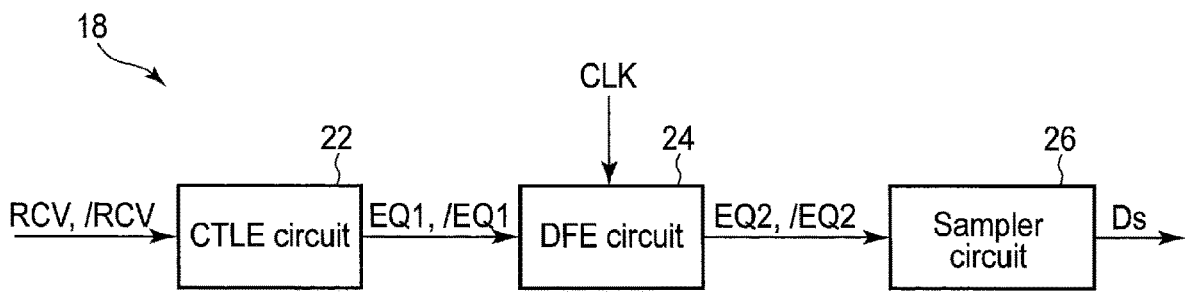
FIG. 3 is a block diagram showing an example of the equalizer circuit in the first embodiment.

FIG. 3 is a block diagram showing an example of the equalizer circuit 18. The equalizer circuit 18 includes a CTLE (Continuous Time Linear Equalizer) circuit 22, a DFE (Decision Feedback Equalizer) circuit 24, and a sampler circuit 26.

The CTLE circuit 22 includes a continuous time linear equalizer. When the CTLE circuit 22 receives the reception signals RCV and /RCV, the CTLE circuit 22 performs a linear equalization process for amplifying (boosting) the gain of the high-frequency band of the reception signals RCV and /RCV, and generates equalization signals EQ1 and /EQ1. The CTLE circuit 22 transmits the equalization signals EQ1 and /EQ1 to the DFE circuit 24.

The DFE circuit 24 is a nonlinear equalizer including a decision feedback equalizer. The DFE circuit 24 determines whether a digital value included in the input signal is "0" or "1" in a plurality of divisions from the present to past based on a clock signal CLK, and generates a decision signal based on the result of the determination. The DFE circuit 24 performs a nonlinear equalization process for feeding back the decision signal to the input signal based on, for example, a particular tap coefficient Wk. The clock signal CLK is generated in advance by a predetermined method. The tap coefficient Wk corresponds to the digital value in a division past by k divisions from a reference time point, where k is an integer greater than or equal to 1 and less than or equal to n (n is an arbitrary natural number).

The DFE circuit 24 combines a feedback signal generated by multiplying the decision signal by the tap coefficient Wk with the equalization signals EQ1 and /EQ1, and generates equalization signals EQ2 and /EQ2. The DFE circuit 24 transmits the equalization signals EQ2 and /EQ2 to the sampler circuit 26.

The sampler circuit 26 determines data included in the equalization signals EQ2 and /EQ2 obtained by the compensation by the CTLE circuit 22 and the DFE circuit 24, and generates a sampling result Ds. In this way, the equalizer circuit 18 obtains the sampling result Ds as the data included in the transmission signals TR and /TR. The sampler circuit 26 may use, for example, an intermediate value (for example, 0 V) of amplitudes of the equalization signals EQ2 and /EQ2, as a reference voltage, and determine the data included in the equalization signals EQ2 and /EQ2 based on whether or not the equalization signals EQ2 and /EQ2 are greater than the reference voltage.

[CTLE Circuit 22]

FIG. 4 is a circuit diagram showing an example of the circuit of the CTLE circuit 22.

The CTLE circuit 22 includes resistors R1, R2, and R3, transistors Tr1, Tr2, Tr3, and Tr4, and capacitors C1, C2, and C3. The transistors Tr1, Tr2, Tr3, and Tr4 are, for example, N-channel metal oxide semiconductor (MOS) field effect transistor (FET).

The transistor Tr1 includes a control terminal to which the reception signal RCV is supplied, a first terminal connected to node N1, and a second terminal connected to node N2. The control terminal may be called a gate terminal. One of the first terminal and the second terminal may be called a source terminal. The other of the first terminal and the second terminal may be called a drain terminal. The resistor R1 includes a first terminal to which first power supply voltage VDD is applied, and a second terminal connected to the node N1. The equalization signal /EQ1 is output from the node N1. The first power supply voltage VDD is a voltage for driving the CTLE circuit 22, for example, a voltage of a power supply.

The transistor Tr2 includes a gate terminal to which signal SIG is supplied, a first terminal connected to node N2, and a second terminal to which second power supply voltage VSS is applied. The second power supply voltage VSS is a voltage different from the first power supply voltage VDD, for example, a voltage of a ground terminal (for example, 0

V). The signal SIG is a signal for determining an operation voltage for an operation of the CTLE circuit 22. The first power supply voltage VDD is a power supply voltage with high potential. The second power supply voltage VSS is a power supply voltage with low potential.

The transistor Tr3 includes a gate terminal to which the reception signal /RCV is supplied, a first terminal connected to node N3, and a second terminal connected to node N4. The resistor R2 includes a first terminal to which the first power supply voltage VDD is applied, and a second terminal connected to node N3. The equalization signal EQ1 is output from the node N3.

The transistor Tr4 includes a gate terminal to which the signal SIG is supplied, a first terminal connected to the node N4, and a second terminal to which the second power supply voltage VSS is applied.

Capacitor C1 includes a first terminal connected to the node N2, and a second terminal connected to the node N4. The resistor R3 includes a first terminal connected to the node N2, and a second terminal connected to the node N4. Thus, the capacitor C1 and the resistor R3 are connected in parallel between the node N2 and the node N4.

Capacitor C2 includes a first terminal connected to the node N1, and a second terminal to which the second power supply voltage VSS is applied. Capacitor C3 includes a first terminal connected to the node N3, and a second terminal to which the second power supply voltage VSS is applied.

FIG. 5 is a diagram showing an example of the equalization characteristics of the CTLE circuit 22.

The CTLE circuit 22 generates the equalization signals EQ1 and /EQ1 by amplifying the gain of the high-frequency band of the reception signals RCV and /RCV with respect to the low-frequency band. The amount B of boost may be defined as the difference between the gain of the low-frequency band and the gain of the high-frequency band in the equalization characteristics of the CTLE circuit 22. The CTLE circuit 22 may be configured to adaptively adjust the equalization characteristics in accordance with the amount of boost instructed from a control circuit (not shown). In this way, the CTLE circuit 22 can be set so as to have optimal equalization characteristics in accordance with the reception signals RCV and /RCV, in other words, the transmission characteristics of the transmission channel 14.

The CTLE circuit 22 directly amplifies the high-frequency band of the reception signals RCV and /RCV. Thus, the noise component included in the amplified high-frequency band may be amplified at the same time. Therefore, the DFE circuit 24 described later may be also used to eliminate the amplified noise component.

[DFE Circuit 24 and Sampler Circuit 26]

Figure 6:
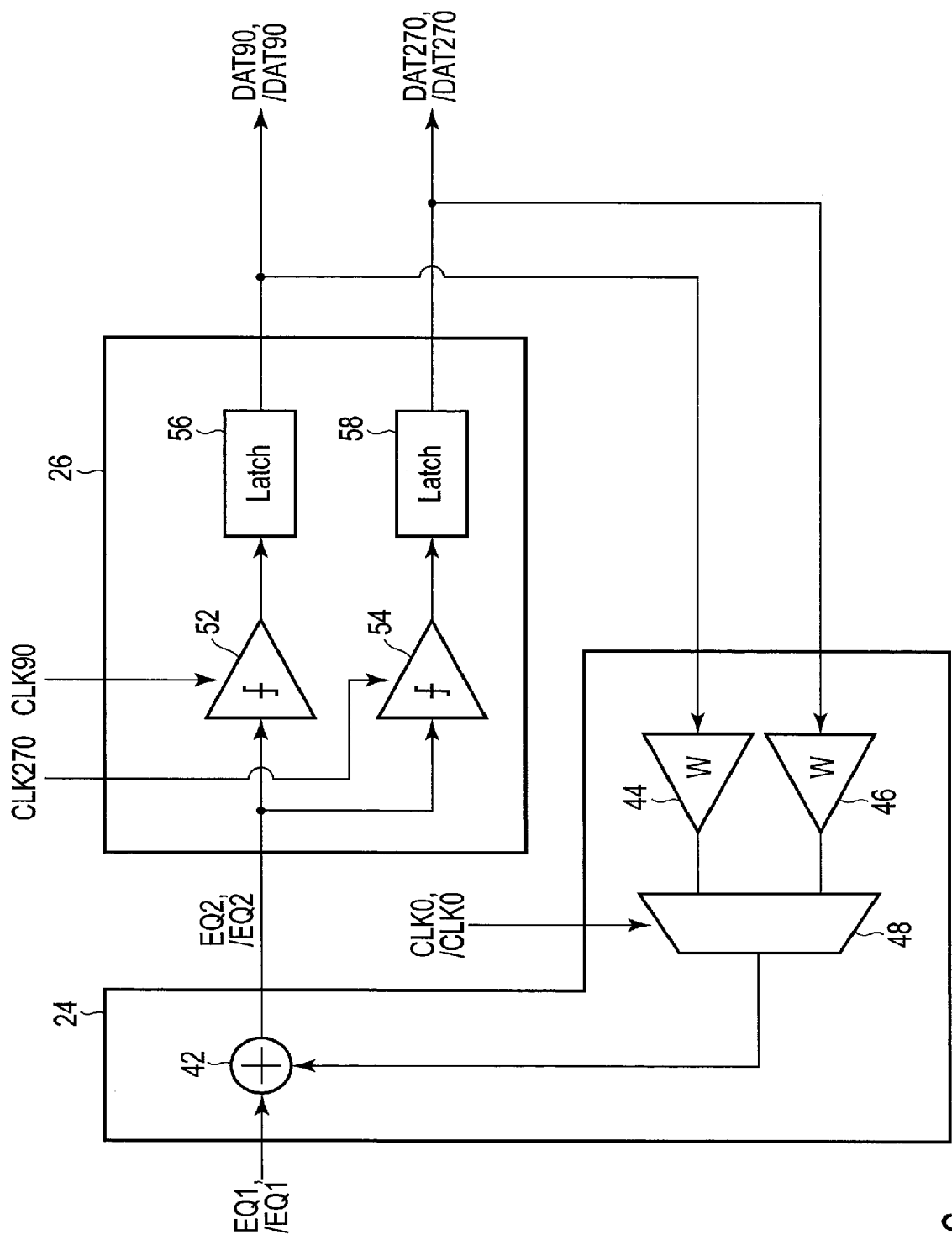
FIG. 6 is a circuit diagram showing examples of a DFE (Decision Feedback Equalizer) circuit and a sampler circuit in the first embodiment.

FIG. 6 is a circuit diagram showing examples of the DFE circuit 24 and the sampler circuit 26. The DFE circuit 24 includes an adder 42, current sources 44 and 46, and a selector 48. The sampler circuit 26 includes determination circuits 52 and 54, and latches 56 and 58.

The adder 42 adds the feedback signal from the sampler circuit 26 to the equalization signals EQ1 and /EQ1, and outputs the obtained signals to the sampler circuit 26 as the equalization signals EQ2 and /EQ2.

When the determination circuit 52 receives the equalization signals EQ2 and /EQ2 from the DFE circuit 24, the determination circuit 52 determines whether the data included in the equalization signals EQ2 and /EQ2 are "0" or "1" in a plurality of time divisions from the current to past, and generates decision signals DAT90 and /DAT90 in accordance with the result of the determination. The decision signal DAT90 is a signal in which the phase lags behind a reference decision signal DAT0 by 90 degrees. The decision signal /DAT90 is the inversion signal of the decision signal DAT90. The time divisions for the determination of the signals are determined based on clock signal CLK90 input to the determination circuit 52. The clock signal CLK90 is a signal in which the phase lags behind a reference clock signal CLK0 by 90 degrees.

The determination circuit 52 transmits the generated decision signals DAT90 and /DAT90 to the latch 56. The latch 56 includes one or more flip-flops, etc., and stores the decision signals DAT90 and /DAT90 over one or more divisions. The latch 56 outputs the decision signals DAT90 and /DAT90 past by one or more time divisions from the input decision signals DAT90 and /DAT90. The decision signals DAT90 and /DAT90 output from the latch 56 are also supplied to the current source 44.

When the determination circuit 54 receives the equalization signals EQ2 and /EQ2 from the DFE circuit 24, the determination circuit 54 determines whether the data included in the equalization signals EQ2 and /EQ2 are "0" or "1" in a plurality of time divisions from the current to past, and generates decision signals DAT270 and /DAT207 in accordance with the result of the determination. The decision signal DAT270 is a signal in which the phase lags behind the reference decision signal DAT0 by 270 degrees. The decision signal /DAT270 is the inversion signal of the decision signal DAT270. The time divisions for the determination of the signals are determined based on clock signal CLK270 input to the determination circuit 54. The clock signal CLK270 is a signal in which the phase lags behind the reference clock signal CLK0 by 270 degrees.

The determination circuit 54 transmits the generated decision signals DAT270 and /DAT270 to the latch 58. The latch 58 includes one or more flip-flops, etc., and stores the decision signals DAT270 and /DAT270 over one or more time divisions. The latch 58 outputs the decision signals DAT270 and /DAT270 past by one or more time divisions from the input decision signals DAT270 and /DAT270. The decision signals DAT270 and /DAT270 output from the latch 58 are also supplied to the current source 46.

The decision signals DAT90 and /DAT90 correspond to, for example, the odd-numbered data items of 1-bit data items arranged chronologically. The decision signals DAT270 and /DAT270 correspond to, for example, the even-numbered data items of 1-bit data items arranged chronologically. Thus, the determination circuits 52 and 54 determine the odd-numbered data items and the even-numbered data items, respectively, of 1-bit data items arranged chronologically.

The current sources 44 and 46 multiply the output signals of the latch circuits 56 and 58, respectively, by coefficient (tap coefficient) W, and supply them to the selector 48. When the latches 56 and 58 store a plurality of past decision signals in a plurality of time divisions, a tap coefficient is determined for each time division.

The selector 48 selects one of the inputs in accordance with the clock signals CLK0 and /CLK0, and supplies the selected signal to the adder 42.

Thus, it is possible to generate the equalization signals EQ2 and /EQ2 in which inter symbol interference is reduced by combining past decision signals DAT and /DAT with the equalization signals EQ1 and /EQ1. It is assumed in FIG. 6 that the latches 56 and 58 store the decision signal of one time division. When the latches 56 and 58 store the decision signals of a plurality of time divisions, the current sources 44 and 46 and the selector 48 are provided for the decision signal of each time division.

A feedback signal is generated based on the decision signals DAT and /DAT indicating "0" or "1". Thus, noise is not amplified. In this manner, the DFE circuit 24 can reduce the effect of noise in comparison with the CTLE circuit 2.

Figure 7:
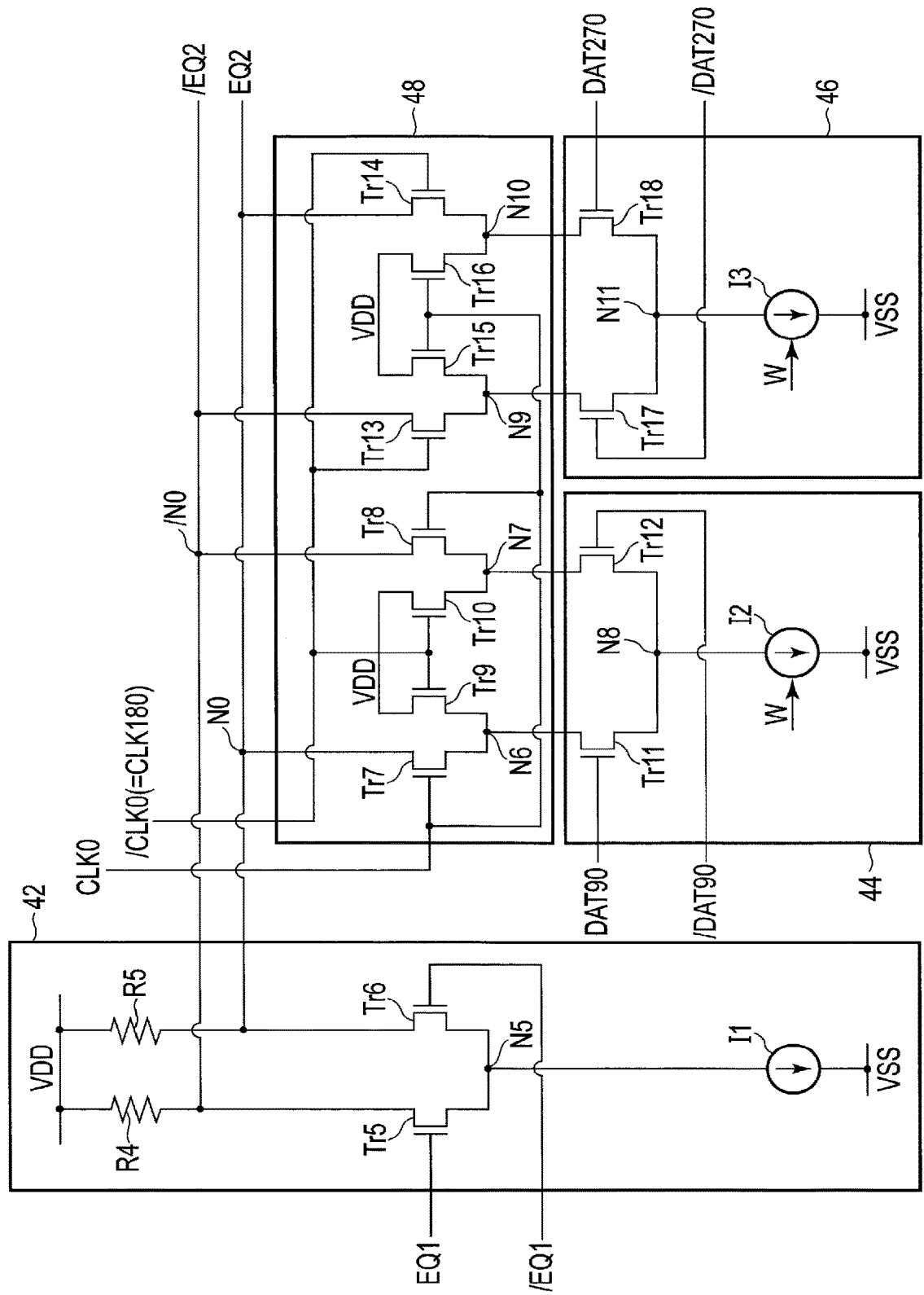
FIG. 7 is a circuit diagram showing an example of the DFE circuit shown in FIG. 6.

FIG. 7 is a circuit diagram showing an example of the DFE circuit 24 shown in FIG. 6.

The adder 42 includes resistors R4 and R5, transistors Tr5 and Tr6, and constant current source I1. The selector 48 includes transistors Tr7, Tr8, Tr9, Tr10, Tr13, Tr14, Tr15, and Tr16. The current source 44 includes transistors Tr11 and Tr12, and variable current source I2. The current source 46 includes transistors Tr17 and Tr18, and variable current source I3. The transistors Tr5, Tr6, Tr7, Tr8, Tr9, Tr10, Tr11, Tr12, Tr13, Tr14, Tr15, Tr16, Tr17, and Tr18 are, for example, N-channel MOSFETs. The adder 42 is connected to the selector 48 via nodes N0 and /N0.

When the latches 56 and 58 of FIG. 6 store the decision signals of a plurality of time divisions, a plurality of circuits each including the current sources 44 and 46 and the selector 48 are connected in parallel to the nodes N0 and /N0.

The transistor Tr5 includes a gate terminal to which the equalization signal EQ1 is supplied, a first terminal connected to the node /N0, and a second terminal connected to node N5. The resistor R4 includes a first terminal to which the first power supply voltage VDD is applied, and a second terminal connected to the node /N0.

The transistor Tr6 includes a gate terminal to which the equalization signal /EQ1 is supplied, a first terminal connected to the node N0, and a second terminal connected to the node N5. The resistor R5 includes a first terminal to which the first power supply voltage VDD is applied, and a second terminal connected to node N0.

The constant current source I1 includes a first terminal connected to the node N5, and a second terminal to which the second power supply voltage VSS is applied. Thus, the constant current source I1 is configured to supply a predetermined amount of current to the transistor Tr5 or the transistor Tr6.

The transistor Tr7 includes a gate terminal to which the clock signal CLK0 is supplied, a first terminal connected to the node N0, and a second terminal connected to node N6. The transistor Tr8 includes a gate terminal to which the clock signal CLK0 is supplied, a first terminal connected to the node /N0, and a second terminal connected to node N7.

The transistor Tr9 includes a gate terminal to which the clock signal /CLK0 is supplied, a first terminal to which the first power supply voltage VDD is applied, and a second terminal connected to the node N6. The transistor Tr10 includes a gate terminal to which the clock signal /CLK0 is supplied, a first terminal to which the first power source voltage VDD is applied, and a second terminal connected to the node N7.

The transistor Tr11 includes a gate terminal to which the decision signal DAT90 is supplied, a first terminal connected to the node N6, and a second terminal connected to node N8. The transistor Tr12 includes a gate terminal to which the decision signal /DAT90 is supplied, a first terminal connected to the node N7, and a second terminal connected to the node N8.

The variable current source I2 includes a first terminal connected to the node N8, a second terminal to which the second power source voltage VSS is applied, and a control terminal to which the tap coefficient W is input. Thus, variable current source I2 is configured to supply a predetermined amount of current to the transistors Tr7 and Tr11 or transistors Tr8 and Tr12.

The variable current source I2 pulls down the voltage of node N0 via the path going through the transistors Tr7 and Tr11 and pull down the voltage of node /N0 via the path going through the transistors Tr8 and Tr12. Thus, the variable current source I2 may set a tap coefficient at the time of feeding back the levels of the decision signals DAT90 and /DAT90 to the nodes N0 and /N0, respectively.

In this structure, the transistors Tr7 to Tr12 and the variable current source I2 feeds back the decision signal for the odd-numbered data items of 1-bit data items arranged chronologically.

The transistor Tr13 includes a gate terminal to which the clock signal /CLK0 is supplied, a first terminal connected to the node /N0, and a second terminal connected to node N9. The transistor Tr14 includes a gate terminal to which the clock signal /CLK0 is supplied, a first terminal connected to the node N0, and a second terminal connected to node N10.

The transistor Tr15 includes a gate terminal to which the clock signal CLK0 is supplied, a first terminal to which the first power supply voltage VDD is applied, and a second terminal connected to the node N9. The transistor Tr16 includes a gate terminal to which the clock signal CLK0 is supplied, a first terminal to which the first power supply voltage VDD is applied, and a second terminal connected to the node N10.

The transistor Tr17 includes a gate terminal to which decision signal /DAT270 is supplied, a first terminal connected to the node N9, and a second terminal connected to node N11. The transistor Tr18 includes a gate terminal to which the decision signal DAT270 is supplied, a first terminal connected to the node N10, and a second terminal connected to the node N11.

The variable current source I3 includes a first terminal connected to the node N11, a second terminal to which the second power supply voltage VSS is applied, and a control terminal to which the tap coefficient W is input. Thus, the variable current source I3 is configured to supply a predetermined amount of current to the transistors Tr13 and Tr17 or the transistors Tr14 and Tr18.

The variable current source I3 pulls down the voltage of the node /N0 via the path going through the transistors Tr13 and Tr17 and pull down the voltage of the node N0 via the path going through the transistors Tr14 and Tr18. Thus, the variable current source I3 may set a tap coefficient at the time of feeding back the levels of the decision signals DAT270 and /DAT270 to the nodes N0 and /N0, respectively.

In this structure, the transistors Tr13 to Tr18 and the variable current source I3 feeds back the decision signal for the even-numbered data items of 1-bit data items arranged chronologically.

The adder 42 outputs the equalization signals EQ2 and /EQ2 via the nodes N0 and /N0, respectively.

[Determination Circuits 52 and 54]

FIG. 8 is a circuit diagram showing an example of the determination circuits 52 and 54 shown in FIG. 6. The determination circuits 52 and 54 have the same structure. In the explanation of FIG. 8, the clock signal CLK90 of the determination circuit 52 and the clock signal CLK270 of the determination circuit 54 are collectively called clock signal CLK, and the decision signals DAT90 and /DAT90 of the determination circuit 52 and the decision signals DAT270 and /DAT270 of the determination circuit 54 are collectively called decision signals DAT and /DAT.

The equalization signals EQ2 and/EQ2 output from the nodes N0 and /N0 of FIG. 7 are input to each of the determination circuits 52 and 54 as differential input signals.

The determination circuits 52 and 54 are differential amplification circuits which amplify the difference between the input signal EQ2 and the inversion input signal /EQ2. Each of the determination circuits 52 and 54 includes N-channel MOS transistors Tr41, Tr42, Tr43, Tr44, Tr45, Tr51 and Tr52, and P-channel MOS transistors Tr53, Tr54, Tr55 and Tr56. The N-channel MOS transistors Tr41, Tr42, Tr43, Tr44, Tr45, Tr51 and Tr52, and P-channel MOS transistors Tr53, Tr54, Tr55 and Tr56 include first terminals, second terminals, and gate terminals, respectively. The gate terminals may be called as control terminals.

The input signal EQ2 is supplied to gate terminals of the transistors Tr41 and Tr44. The inversion signal /EQ2 of the input signal EQ2 is supplied to gate terminals of the transistors Tr42 and Tr45. Second terminal of each of the transistors Tr41, Tr42, Tr44, and Tr45 is connected to a first terminal of the transistor Tr43. The second power supply voltage VSS is applied to a second terminal of the transistor Tr43.

A first terminal of the transistor Tr41 is connected to a second terminal of the transistor Tr51. A first terminal of the transistor Tr42 is connected to a second terminal of the transistor Tr52. A gate terminal of the transistor Tr51 is connected to a first terminal of the transistor Tr52. A gate terminal of the transistor Tr52 is connected to a first terminal of the transistor Tr51.

A first terminal of the transistor Tr51 is connected to a second terminal of the transistor Tr53 and a second terminal of the transistor Tr55. A first terminal of the transistor Tr52 is connected to a second terminal of the transistor Tr54 and a second terminal of the transistor Tr56.

A gate terminal of the transistor Tr53 is connected to a gate terminal of the transistor Tr51, the second terminal of the transistor Tr54 and the first terminal of the transistor Tr52. A gate terminal of the transistor Tr54 is connected to a gate terminal of the transistor Tr52, the second terminal of the transistor Tr53 and the first terminal of the transistor Tr51.

First inverter INV1 includes the transistors Tr54 and Tr52. An input terminal of the first inverter INV1 is the gate terminals of the transistors Tr54 and Tr52. An output terminal of the first inverter INV1 is the connection point between the second terminal of the transistor Tr54 and the first terminal of the transistor Tr52.

Second inverter INV2 includes the transistors Tr53 and Tr51. An input terminal of the second inverter INV2 is the gate terminals of the transistors Tr53 and Tr51. An output terminal of the second inverter INV2 is the connection point between the second terminal of the transistor Tr53 and the first terminal of the transistor Tr51.

The output terminal of the first inverter INV1 is connected to the input terminal of the second inverter INV2. The output terminal of the second inverter INV2 is connected to the input terminal of the first inverter INV1.

A gate terminal of the transistor Tr55 is connected to a gate terminal of the transistor Tr56.

The first power supply voltage VDD is applied to first terminals of the transistors Tr53, Tr54, Tr55, and Tr56.

The first terminal of the transistor Tr44 is connected to the first terminal of the transistor Tr51, the second terminals of the transistors Tr53 and Tr55 and the gate terminals of the transistors Tr54 and Tr52.

The first terminal of the transistor Tr45 is connected to the first terminal of the transistor Tr52, the second terminals of the transistors Tr54 and Tr56 and the gate terminals of the transistors Tr53 and Tr51.

The first terminal of the transistor Tr45, the first terminal of the transistor Tr52, the second terminals of the transistors Tr54 and Tr56 and the gate terminals of the transistors Tr53 and Tr51 are connected to the output terminal of the first inverter INV1. The decision signal DAT is output from the output terminal of the first inverter INV1.

The first terminal of the transistor Tr44, the first terminal of the transistor Tr51, the second terminals of the transistors Tr53 and Tr55 and the gate terminals of the transistors Tr54 and Tr52 are connected to the output terminal of the second inverter INV2. The decision signal /DAT is output from the output terminal of the second inverter INV2.

[Operation of Determination Circuits 52 and 54]

Figure 9:
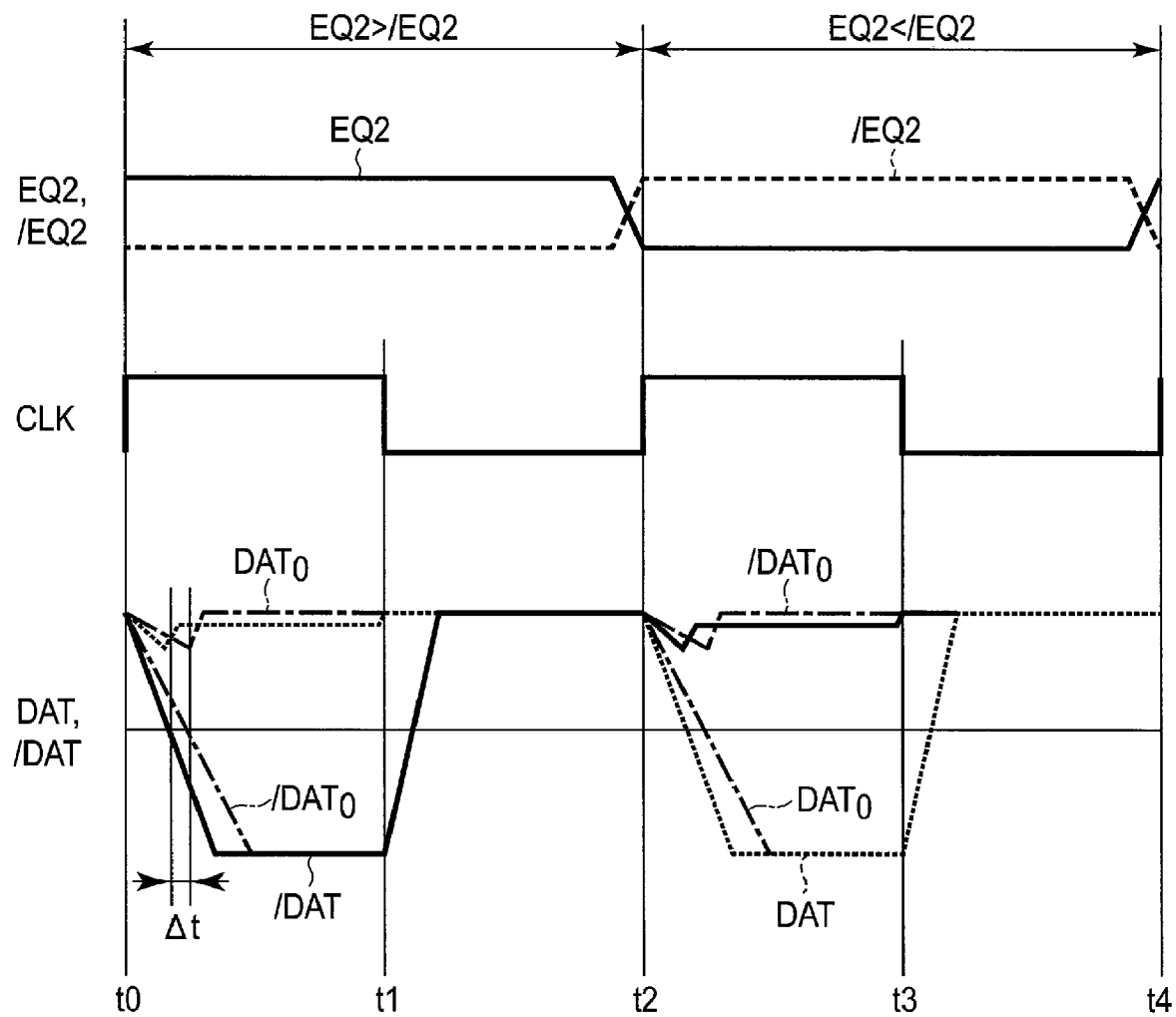
FIG. 9 is a timing chart of an operation example of the determination circuits shown in FIG. 8.

FIG. 9 is the timing chart of an operation example of the determination circuits 52 and 54. FIG. 9 shows an example of the waveforms of the clock signal CLK and the decision signals DAT and /DAT. The clock signal CLK indicates the clock signal CLK90 regarding the determination circuit 52, and indicates the clock signal CLK270 regarding the determination circuit 54. The decision signals DAT and /DAT indicate the decision signals DAT90 and /DAT90 regarding the determination circuit 52, and indicate the decision signals DAT270 and /DAT270 regarding the determination circuit 54.

During EQ2>/EQ2 (in other words, during EQ2=H and /EQ2=L), when the transistors Tr41 and Tr44 are conductive (ON state), and the clock signal CLK transitions from L-level to H-level at timing t0, the transistor Tr43 is conductive. Accordingly, current flows through the inverters INV1 and INV2, and the voltages of the decision signals DAT and /DAT output from the inverters INV1 and INV2 are decreased. It is assumed that EQ2>/EQ2>VthN. VthN is the threshold voltage of N-channel MOS transistors Tr41, Tr42, Tr44 and Tr45. During EQ2>/EQ2, the voltage of the decision signal /DAT is decreased faster than the voltage of the decision signal DAT, and the voltage of the decision signal /DAT reaches VthN (the horizontal line of FIG. 9) earlier. Subsequently, the voltage of the decision signal /DAT is further decreased to the voltage of L-level, and the voltage of the decision signal DAT is increased to the voltage of H-level. When the decision signal /DAT reaches L-level, the transistor Tr52 is not conductive (OFF state). When the decision signal DAT reaches H-level, the transistor Tr53 is not conductive (OFF state).

When the clock signal CLK transitions from H-level to L-level at timing t1, the transistor Tr43 is not conductive, and current does not flow through the inverters INV1 and INV2. Further, the transistors Tr55 and Tr56 are conductive. Current flows through the transistors Tr55 and Tr56. The output terminals of the inverters INV1 and INV2 which output the decision signals are charged. The voltages of the decision signals DAT and /DAT return to the initial state (H-level).

During EQ2</EQ2 (in other words, during EQ2=L and /EQ2=H), when the transistors Tr42 and Tr45 are conductive (ON state), and the clock signal CLK transitions from L-level to H-level at timing t2, the transistor Tr43 is conductive. Accordingly, the voltages of the decision signals DAT and /DAT are decreased. When EQ2</EQ2, the voltage of the decision signal DAT is decreased faster than the voltage of the decision signal /DTA, and the voltage of the decision signal DAT reaches the threshold level earlier. Subsequently, the voltage of the decision signal DAT is further decreased to the voltage of L-level, and the voltage of the decision signal /DAT is increased to the voltage of H-level.

When the clock signal CLK transitions from H-level to L-level at timing t3, in a manner similar to that of the operation of timing t1, the voltages of the decision signals DAT and /DAT return to the initial state (H-level).

Now, the effect of the transistors Tr44 and Tr45 is described. The transistors Tr44 and Tr45 accelerate the decrease of the voltages of the decision signals DAT and /DAT.

In a case where neither the transistor Tr44 nor transistor Tr45 is connected, after the clock signal CLK reaches H-level, during EQ2>/EQ2, the voltage of the decision signal DAT starts to decrease after the two-stage transistors Tr41 and Tr51 are conductive, and during EQ2>/EQ2, the voltage of the decision signal /DAT starts to decrease after the two-stage transistors Tr42 and Tr52 are conductive. In other words, the voltages of the decision signals DAT and /DAT start to decrease in accordance with the passage of time in which two-stage transistors are conductive after the clock signal CLK reaches H-level. Thus, when neither the transistor Tr44 nor transistor Tr45 is connected, as shown by the alternate long and short dash lines, the decreasing speed of the voltages of the decision signals DAT0 and /DAT0 is gentle.

In a case where transistors Tr44 and Tr45 are connected, after the clock signal CLK reaches H-level, the voltage of the decision signal DAT starts to decrease when the transistor Tr44 is conductive, and the voltage of the decision signal /DAT starts to decrease when the transistor Tr45 is conductive. In other words, the voltages of the decision signals DAT and /DAT start to decrease in accordance with the passage of time in which one transistor is conductive after the clock signal CLK reaches H-level. In this way, the time in which the level of the decision signals DAT and /DAT is decreased to the threshold level in a case where the transistors Tr44 and Tr45 are connected is shortened by Δt in comparison with the time in which the level of the decision signals DAT0 and /DAT0 is decreased to the threshold level in a case where neither the transistor Tr44 nor transistor Tr45 is connected. This shortened time Δt is the turn-on time of the transistor.

Thus, during EQ2>/EQ2, the time from when clock signal CLK reaches H-level until output signal /DAT is output can be shortened by connecting transistor Tr44 in parallel with the series circuit of the transistors Tr41 and Tr51 connected between the output terminal of inverter INV2 and transistor Tr43. Similarly, during EQ2</EQ2, the time from when clock signal CLK reaches H-level until output signal DAT is output can be shortened by connecting transistor Tr45 in parallel with the series circuit of the transistors Tr42 and Tr52 connected between the output terminal of inverter INV1 and transistor Tr43.

In the determination circuit of the DFE circuit which determines the level of the reception signals in serial transmission, the delay of output may cause the state in which the level cannot be determined. In the determination circuits 52 and 54 of the present embodiment, the delay time from when the level of the clock signal has transitioned until the level of output is stabilized can be shortened. Thus, even when the speed of the serial transmission is increased, the level of the reception signals can be assuredly determined.

FIG. 10 is the circuit diagram of determination circuits 52a and 54a according to another modified example of the present embodiment. Each of the determination circuits 52a and 52b includes P-channel MOS transistors Tr57 and Tr58 in addition to the structural elements of the determination circuits 52 and 52 shown in FIG. 8. The P-channel MOS transistors Tr57 and TR58 include first terminals, second terminals, and gate terminals, respectively. The gate terminals may be called as control terminals.

A first terminal of the transistor Tr57 is connected to the first terminal of the transistor Tr42 and the second terminal of the transistor Tr52. A second terminal of the transistor Tr57 is connected to the first terminal of the transistor Tr41 and the second terminal of the transistor Tr51. The clock signal CLK is supplied to a gate terminal of the transistor Tr57.

The clock signal CLK is supplied to a gate terminal of the transistor Tr58.

A first terminal of the transistor Tr58 is connected to the first terminal of the transistor Tr45, the first terminal of the transistor Tr52, the second terminals of the transistors Tr54 and Tr56 and the gate terminals of the transistors Tr53 and Tr51. Thus, the first terminal of the transistor Tr58 is connected to the output terminal of the first inverter INV1. The decision signal DAT is output from the output terminal of the first inverter INV1 connected to the first terminal of the transistor Tr58.

A second terminal of the transistor Tr58 is connected to the first terminal of the transistor Tr44, the first terminal of the transistor Tr51, the second terminals of the transistors Tr53 and Tr55 and the gate terminals of the transistors Tr54 and Tr52. Thus, the second terminal of the transistor Tr58 is connected to the output terminal of the second inverter INV2. The decision signal /DAT is output from the output terminal of the second inverter INV2 connected to the second terminal of the transistor Tr58.

When the transistor Tr58 is conductive, it is possible to short-circuit the path (Tr45 path) including the transistor Tr45 to which current based on the equalization signal /EQ2 is supplied, and the path (Tr44 path) including the transistor Tr44 to which current based on signal EQ2 is supplied. A differential pair of paths is formed by the Tr45 path connected to the first terminal of the transistor Tr58 and the Tr44 path connected to the second terminal of the transistor Tr58.

In a pre-charge state, the resistance of the Tr45 path viewed from the output terminal of the inverter INV1 seems to be different from the resistance of the Tr44 path viewed from the output terminal of the inverter INV2 in accordance with the levels of the equalization signals EQ2 and /EQ2. When the resistances of the current paths of the differential pair are imbalanced, the off-leak currents of the transistors differ, thereby causing a difference in the output voltages of the decision signals DAT and /DAT. Thus, the requirements for the setup time or hold time may not be satisfied.

However, according to the determination circuits 52a and 54a shown in FIG. 10, when the clock signal CLK is at L-level, the transistor Tr58 is conductive and short-circuits the two current paths of the differential pair (the Tr45 path and the Tr44 path). This short-circuit can resolve the imbalance between the off-leak current of the transistors of the path including the transistor Tr45 viewed from the output terminal of the inverter INV1 and the off-leak current of the transistors of the path including the transistor Tr44 viewed from the output terminal of the inverter INV2 and resolve the imbalance of the difference in the output voltages of the decision signals DAT and /DAT. Thus, the setup time or hold time when the clock signal CLK becomes H-level can be assured to have characteristics satisfying the requirements.

Similarly, the transistor Tr57 can short-circuit the path of the transistors Tr52 and Tr42 to which current based on the input signal /EQ2 is supplied, and the path of the transistors Tr51 and Tr41 to which current based on input signal EQ2 is supplied. A differential pair of paths is formed by the path of the transistors Tr52 and Tr42 connected to the first terminal of the transistor Tr57 and the path of the transistors Tr51 and Tr41 connected to the second terminal of the transistor Tr57.

FIG. 11 shows the decision signals DAT and /DAT when the transistor Tr58 is connected (with Tr58) and the decision signals DAT and /DAT when the transistor Tr58 is not connected (without Tr58). When the transistor Tr58 is conductive, the imbalance of the difference Δv in the output voltages of the decision signals DAT and /DAT can be resolved.

According to the determination circuits 52a and 54a shown in FIG. 10, when the clock signal CLK is at L-level, the transistor Tr58 is conductive, and short-circuits the two current paths of the differential pair (the path of the transistor Tr45 and the path of the transistor Tr44). When the clock signal CLK is at L-level, the transistor Tr57 is conductive, and short-circuits the two current paths of the differential pair (the path of the transistors Tr52 and Tr42 and the path of the transistors Tr51 and Tr41). This short-circuit allows the elimination of the imbalance between the capacity of the path including the transistors Tr52 and Tr42 viewed from the output terminal of the inverter INV1 and the capacity of the path including the transistors Tr51 and Tr41 viewed from the output terminal of the inverter INV2. In this way, the characteristics of the setup time or hold time can satisfy the requirements.

Now, determination circuits 52b and 54b according to yet another example of the embodiment are described. FIG. 12 relates to yet another modified example of FIG. 10. In FIG. 12, the N-channel MOS transistors of FIG. 10 are replaced by P-channel MOS transistors, and the P-channel MOS transistors of FIG. 10 are replaced by N-channel MOS transistors.

The determination circuits 52b and 54b include P-channel MOS transistors Tr41b, Tr42b, Tr43b, Tr44b, Tr45b, Tr53b and Tr54b, and N-channel MOS transistors Tr51b, Tr52b, Tr55b, Tr56b, Tr57b, and Tr58b.

The equalization signal EQ2 is supplied to gate terminals of the transistors Tr41b and Tr44b. The equalization signal /EQ2 is supplied to gate terminals of the transistors Tr42b and Tr45b. A first terminal of each of the transistors Tr41b, Tr42b, Tr44b, and Tr45b is connected to a second terminal of the transistor Tr43b. A first power source voltage is applied to a first terminal of the transistor Tr43b. The first power supply voltage is, for example, VDD.

A second terminal of the transistor Tr41b is connected to a first terminal of the transistor Tr53b. A second terminal of the transistor Tr42b is connected to a first terminal of the transistor Tr54b. A gate terminal of the transistor Tr53b is connected to a second terminal of the transistor Tr54b. A gate terminal of the transistor Tr54b is connected to a second terminal of the transistor Tr53b.

The second terminal of the transistor Tr53b is connected to a first terminal of the transistor Tr51b and a first terminal of the transistor Tr55b. A second terminal of the transistor Tr54b is connected to a first terminal of the transistor Tr52b and a first terminal of the transistor Tr56b.

A gate terminal of the transistor Tr53b is further connected to a gate terminal of the transistor Tr51b, a first terminal of the transistor Tr52b and a first terminal of the transistor Tr56b. A gate terminal of the transistor Tr54b is further connected to a gate terminal of the transistor Tr52b, a first terminal of the transistor Tr51b and a first terminal of the transistor Tr53b.

A gate terminal of the transistor Tr55b is connected to a gate terminal of the transistor Tr56b.

A second power source voltage is applied to second terminals of the transistors Tr51b, Tr52b, Tr55b, and Tr56b. The second power source voltage is, for example, VSS.

A first inverter INV1b includes the transistors Tr54b and Tr52b. An input terminal of the first inverter INV1b is the gate terminals of the transistors Tr54b and Tr52b. An output terminal of the first inverter INV1b is the connection point between the second terminal of the transistor Tr54b and the first terminal of the transistor Tr52b.

A second inverter INV2b includes the transistors Tr53b and Tr51b. An input terminal of the second inverter INV2b is the gate terminals of the transistors Tr53b and Tr51b. An output terminal of the second inverter INV2b is the connection point between the second terminal of the transistor Tr53b and the first terminal of the transistor Tr51b.

The output terminal of first inverter INV1b is connected to the input terminal of second inverter INV2b. The output terminal of the second inverter INV2b is connected to the input terminal of the first inverter INV1b.

A second terminal of the transistor Tr44b is connected to the second terminal of the transistor Tr53b, the first terminals of the transistors Tr51b and Tr55b and the gate terminals of the transistors Tr54b and Tr52b.

A second terminal of the transistor Tr45b is connected to the second terminal of the transistor Tr54b, the first terminals of the transistors Tr52b and Tr56b and the gate terminals of the transistors Tr53b and Tr51b.

The second terminal of the transistor Tr45b, the second terminal of the transistor Tr54b, the first terminals of the transistors Tr52b and Tr56b and the gate terminals of the transistors Tr53b and Tr51b are connected to the output terminal of the first inverter INV1b. The decision signal DAT is output from the output terminal of the first inverter INV1b.

The second terminal of the transistor Tr44b, the second terminal of the transistor Tr53b, the first terminals of the transistors Tr51b and Tr55b and the gate terminals of the transistors Tr54b and Tr52b are connected to the output terminal of the second inverter INV2b. The decision signal /DAT is output from the output terminal of the second inverter INV2b.

A first terminal of the transistor Tr57b is connected to the second terminal of the transistor Tr42b and the first terminal of the transistor Tr54b. A second terminal of the transistor Tr57b is connected to the second terminal of the transistor Tr41b and the first terminal of the transistor Tr53b. The clock signal CLK is supplied to a gate terminal of the transistor Tr57b.

The clock signal CLK is supplied to a gate terminal of the transistor Tr58b.

A first terminal of the transistor Tr58b is connected to the second terminal of the transistor Tr45b, the second terminal of the transistor Tr54b, the first terminals of the transistors Tr52b and Tr56b, and the gate terminals of the transistors Tr53b and Tr51b. Thus, the first terminal of the transistor Tr58b is connected to the output terminal of the first inverter INV1b.

A second terminal of the transistor Tr58b is connected to the second terminal of the transistor Tr44b, the second terminal of the transistor Tr53b, the first terminals of the transistors Tr51b and Tr55b, and the gate terminals of the transistors Tr54b and Tr52b. Thus, the second terminal of the transistor Tr58b is connected to the output terminal of the second inverter INV2b.

This structure also causes an effect similar to that of the determination circuits 52a and 54a of FIG. 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit device, comprising:
a first transistor comprising a first terminal, a second terminal, and a control terminal to which an input signal is supplied;
a second transistor comprising a first terminal, a second terminal, and a control terminal to which an inversion signal of the input signal is supplied;
a first inverter comprising an input terminal, an output terminal, a first terminal to which a first voltage is applied, and a second terminal connected to the first terminal of the second transistor;
a second inverter comprising an input terminal, an output terminal, a first terminal to which the first voltage is applied, and a second terminal connected to the first terminal of the first transistor;
a third transistor comprising a first terminal, a second terminal, and a control terminal to which the input signal is supplied;
a fourth transistor comprising a first terminal, a second terminal, and a control terminal to which the inversion signal is supplied; and
a fifth transistor comprising a first terminal and a second terminal, the first terminal being connected to the second terminal of the first transistor, the second terminal of the second transistor, the second terminal of the third transistor, and the second terminal of the fourth transistor, a second voltage different from the first voltage being applied to the second terminal of the fifth transistor, wherein
the input signal is supplied to the control terminal of the first transistor and the control terminal of the third transistor in parallel,
the inversion signal of the input signal is supplied to the control terminal of the second transistor and the control terminal of the fourth transistor in parallel,
the output terminal of the first inverter is connected to the input terminal of the second inverter,
the output terminal of the second inverter is connected to the input terminal of the first inverter,
the first terminal of the third transistor is connected to the output terminal of the second inverter, and
the first terminal of the fourth transistor is connected to the output terminal of the first inverter.

2. The semiconductor integrated circuit device of claim 1, wherein
the first inverter comprises a sixth transistor and a seventh transistor,
the second inverter comprises an eighth transistor and a ninth transistor,
the sixth transistor comprises a first terminal to which the first voltage is applied, a second terminal connected to a first terminal of the seventh transistor and the output terminal of the first inverter, and a control terminal connected to the output terminal of the second inverter,
the seventh transistor comprises the first terminal connected to the second terminal of the sixth transistor and the output terminal of the first inverter, a second terminal connected to the first terminal of the second transistor, and a control terminal connected to the output terminal of the second inverter,
the eighth transistor comprises a first terminal to which the first voltage is applied, a second terminal connected to a first terminal of the ninth transistor and the output terminal of the second inverter, and a control terminal connected to the output terminal of the first inverter, and
the ninth transistor comprises the first terminal connected to the second terminal of the eighth transistor and the output terminal of the second inverter, a second terminal connected to the first terminal of the first transistor, and a control terminal connected to the output terminal of the first inverter.

3. The semiconductor integrated circuit device of claim 2, further comprising a tenth transistor comprising a first terminal connected to the first terminal of the fourth transistor, a second terminal connected to the first terminal of the third transistor, and a control terminal to which a clock signal is supplied.

4. The semiconductor integrated circuit device of claim 3, further comprising an eleventh transistor comprising a first terminal connected to the first terminal of the first transistor, a second terminal connected to the first terminal of the second transistor, and a control terminal to which the clock signal is supplied.

5. The semiconductor integrated circuit device of claim 4, further comprising:
a twelfth transistor comprising a first terminal to which the first voltage is applied, a second terminal connected to the output terminal of the second inverter, and a control terminal to which the clock signal is supplied; and
a thirteenth transistor comprising a first terminal to which the first voltage is applied, a second terminal connected to the output terminal of the first inverter, and a control terminal to which the clock signal is supplied.

6. The semiconductor integrated circuit device of claim 5, wherein
the first transistor, the second transistor, the third transistor, the fourth transistor, the fifth transistor, the seventh transistor, and the ninth transistor are N-channel field-effect transistors, and
the sixth transistor, the eighth transistor, the tenth transistor, the eleventh transistor, the twelfth transistor, and the thirteenth transistor are P-channel field-effect transistors.

7. The semiconductor integrated circuit device of claim 5, wherein
the first transistor, the second transistor, the third transistor, the fourth transistor, the fifth transistor, the seventh transistor, and the ninth transistor are P-channel field-effect transistors, and
the sixth transistor, the eighth transistor, the tenth transistor, the eleventh transistor, the twelfth transistor and, the thirteenth transistor are N-channel field-effect transistors.

8. A reception device, comprising:
a determination circuit to which an input signal and an inversion signal of the input signal are input, and configured to determine a level of the input signal and a level of the inversion signal;

a plurality of latch circuits configured to store an output of the determination circuit in a plurality of periods; and a feedback circuit configured to multiply outputs of the latch circuits by respective tap coefficients, and to add results of multiplication to an input of the determination circuit, wherein the determination circuit comprises:

a first transistor comprising a first terminal, a second terminal, and a control terminal to which the input signal is supplied;

a second transistor comprising a first terminal, a second terminal, and a control terminal to which the inversion signal is supplied;

a first inverter comprising an input terminal, an output terminal, a first terminal to which a first voltage is applied, and a second terminal connected to the first terminal of the second transistor;

a second inverter comprising an input terminal, an output terminal, a first terminal to which the first voltage is applied, and a second terminal connected to the first terminal of the first transistor;

a third transistor comprising a first terminal, a second terminal, and a control terminal to which the input signal is supplied;

a fourth transistor comprising a first terminal, a second terminal, and a control terminal to which the inversion signal is supplied; and a fifth transistor comprising a first terminal and a second terminal, the first terminal being connected to the second terminal of the first transistor, the second terminal of the second transistor, the second terminal of the third transistor, and the second terminal of the fourth transistor, a second voltage different from the first voltage being applied to the second terminal of the fifth transistor, wherein the input signal is supplied to the control terminal of the first transistor and the control terminal of the third transistor in parallel, the inversion signal of the input signal is supplied to the control terminal of the second transistor and the control terminal of the fourth transistor in parallel, the output terminal of the first inverter is connected to the input terminal of the second inverter, the output terminal of the second inverter is connected to the input terminal of the first inverter, the first terminal of the third transistor is connected to the output terminal of the second inverter, and the first terminal of the fourth transistor is connected to the output terminal of the first inverter.

9. The reception device of claim 8, wherein the first inverter comprises a sixth transistor and a seventh transistor, the second inverter comprises an eighth transistor and a ninth transistor, the sixth transistor comprises a first terminal to which the first voltage is applied, a second terminal connected to a first terminal of the seventh transistor and the output terminal of the first inverter, and a control terminal connected to the output terminal of the second inverter, the seventh transistor comprises the first terminal connected to the second terminal of the sixth transistor and the output terminal of the first inverter, a second terminal connected to the first terminal of the second transistor, and a control terminal connected to the output terminal of the second inverter, the eighth transistor comprises a first terminal to which the first voltage is applied, a second terminal connected to a first terminal of the ninth transistor and the output terminal of the second inverter, and a control terminal connected to the output terminal of the first inverter, and the ninth transistor comprises the first terminal connected to the second terminal of the eighth transistor and the output terminal of the second inverter, a second terminal connected to the first terminal of the first transistor, and a control terminal connected to the output terminal of the first inverter.

10. The reception device of claim 9, further comprising a tenth transistor comprising a first terminal connected to the first terminal of the fourth transistor, a second terminal connected to the first terminal of the third transistor, and a control terminal to which a clock signal is supplied.

11. The reception device of claim 10, further comprising an eleventh transistor comprising a first terminal connected to the first terminal of the first transistor, a second terminal connected to the first terminal of the second transistor, and a control terminal to which the clock signal is supplied.

12. The reception device of claim 11, further comprising:

a twelfth transistor comprising a first terminal to which the first voltage is applied, a second terminal connected to the output terminal of the second inverter, and a control terminal to which the clock signal is supplied; and a thirteenth transistor comprising a first terminal to which the first voltage is applied, a second terminal connected to the output terminal of the first inverter, and a control terminal to which the clock signal is supplied.

13. The reception device of claim 12, wherein the first transistor, the second transistor, the third transistor, the fourth transistor, the fifth transistor, the seventh transistor and the ninth transistor are N-channel field-effect transistors, and the sixth transistor, the eighth transistor, the tenth transistor, the eleventh transistor, the twelfth transistor and the thirteenth transistor are P-channel field-effect transistors.

14. The reception device of claim 12, wherein the first transistor, the second transistor, the third transistor, the fourth transistor, the fifth transistor, the seventh transistor and the ninth transistor are P-channel field-effect transistors, and the sixth transistor, the eighth transistor, the tenth transistor, the eleventh transistor, the twelfth transistor and the thirteenth transistor are N-channel field-effect transistors.

15. The semiconductor integrated circuit device of claim 1, wherein the first inverter comprises a sixth transistor and a seventh transistor serially connected to each other, the second terminal of the first inverter is a drain or source terminal of the seventh transistor, the first terminal of the fourth transistor is connected to a connection point between the sixth transistor and the seventh transistor, the second inverter comprises an eighth transistor and a ninth transistor serially connected to each other, the second terminal of the second inverter is a drain or source terminal of the ninth transistor, and the first terminal of the third transistor is connected to a connection point between the eighth transistor and the ninth transistor.

16. The reception device of claim 8, wherein
the first inverter comprises a sixth transistor and a seventh transistor serially connected to each other,
the second terminal of the first inverter is a drain or source terminal of the seventh transistor,
the first terminal of the fourth transistor is connected to a connection point between the sixth transistor and the seventh transistor,
the second inverter comprises an eighth transistor and a ninth transistor serially connected to each other,
the second terminal of the second inverter is a drain or source terminal of the ninth transistor, and
the first terminal of the third transistor is connected to a connection point between the eighth transistor and the ninth transistor.

\* \* \* \* \*